United States Patent
Kim et al.

(10) Patent No.: US 11,751,439 B2
(45) Date of Patent: Sep. 5, 2023

(54) DISPLAY DEVICE AND MANUFACTURING METHOD THEREOF INCLUDING CONTACT HOLES OPTIMIZED TO PREVENT EXCESS HYDROGEN FROM INTRODUCING INTO SEMICONDUCTOR LAYER

(71) Applicant: Samsung Display Co., LTD., Yongin-si (KR)

(72) Inventors: Hyung Jun Kim, Seoul (KR); So Young Koo, Yongin-si (KR); Eok Su Kim, Seoul (KR); Yun Yong Nam, Hwaseong-si (KR); Jun Hyung Lim, Seoul (KR); Kyung Jin Jeon, Incheon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 70 days.

(21) Appl. No.: 17/220,966

(22) Filed: Apr. 2, 2021

(65) Prior Publication Data
US 2022/0013608 A1  Jan. 13, 2022

(30) Foreign Application Priority Data
Jul. 7, 2020 (KR) .................. 10-2020-0083521

(51) Int. Cl.
*H10K 59/124* (2023.01)
*H10K 59/126* (2023.01)
(Continued)

(52) U.S. Cl.
CPC ......... *H10K 59/124* (2023.02); *H10K 59/126* (2023.02); *H10K 59/1213* (2023.02);
(Continued)

(58) Field of Classification Search
CPC ............. H01L 27/1214; H01L 27/1225; H01L 27/124; H01L 27/1248; H01L 27/3258;
(Continued)

(56) References Cited

U.S. PATENT DOCUMENTS

2011/0312118 A1   12/2011  Izumi et al.
2013/0193431 A1    8/2013  Yamazaki
(Continued)

FOREIGN PATENT DOCUMENTS

JP        6585757        9/2019
KR    1020090004500 A    1/2009
(Continued)

OTHER PUBLICATIONS

European Search Report—European Patent Application No. 21184110.1 dated Dec. 2, 2021, citing references listed within.

*Primary Examiner* — Matthew E. Gordon
(74) *Attorney, Agent, or Firm* — CANTOR COLBURN LLP

(57) ABSTRACT

A display device includes: a substrate; a first semiconductor layer disposed on the substrate, where the first semiconductor layer includes a channel region and a doped region; a first gate electrode disposed to overlap the channel region of the first semiconductor layer; an intermediate film disposed on the first semiconductor layer and the first gate electrode; and a first electrode disposed on the intermediate film, where an opening is defined through the intermediate film to overlap the doped region of the first semiconductor layer, the doped region of the first semiconductor layer and the first electrode contacts each other through the opening, and an area of a cross-section of the opening parallel to the substrate is in a range of about 49 μm² to about 81 μm².

14 Claims, 28 Drawing Sheets

(51) Int. Cl.
*H10K 59/131* (2023.01)
*H10K 59/121* (2023.01)
*H10K 71/00* (2023.01)
*H01L 27/12* (2006.01)
*H01L 29/786* (2006.01)
*H10K 59/12* (2023.01)

(52) U.S. Cl.
CPC ........... *H10K 59/131* (2023.02); *H10K 71/00* (2023.02); *H01L 27/124* (2013.01); *H01L 27/1225* (2013.01); *H01L 27/1248* (2013.01); *H01L 29/7869* (2013.01); *H01L 29/78633* (2013.01); *H10K 59/1201* (2023.02)

(58) Field of Classification Search
CPC ............. H01L 27/3262; H01L 27/3272; H01L 27/3276; H01L 29/78633; H01L 29/7869; H01L 51/56; H01L 2227/323; H10K 50/865; H10K 59/8792; H10K 71/00; H10K 71/40; H10K 71/421; H10K 71/441
USPC .......................................................... 257/40
See application file for complete search history.

(56) References Cited

U.S. PATENT DOCUMENTS

| | | |
|---|---|---|
| 2014/0284606 A1 | 9/2014 | Lu et al. |
| 2016/0351598 A1 | 12/2016 | Yamazaki |
| 2016/0358991 A1* | 12/2016 | Fang ..................... H01L 27/124 |
| 2017/0033109 A1 | 2/2017 | Yamazaki |
| 2017/0363894 A1 | 12/2017 | Uchida et al. |
| 2019/0206971 A1* | 7/2019 | Kim .................... H01L 27/3276 |
| 2019/0206972 A1* | 7/2019 | Park .................... H01L 27/1225 |
| 2019/0280068 A1 | 9/2019 | Shin et al. |
| 2020/0075637 A1 | 3/2020 | Yamazaki |
| 2021/0066352 A1* | 3/2021 | Cheng ............... G02F 1/133345 |
| 2021/0335838 A1 | 10/2021 | Yamazaki |

FOREIGN PATENT DOCUMENTS

| | | |
|---|---|---|
| KR | 1020160029487 A | 3/2016 |
| KR | 1020170015179 | 2/2017 |
| KR | 1020170083752 A | 7/2017 |
| KR | 1020190126019 A | 11/2019 |

* cited by examiner

DISPLAY DEVICE AND MANUFACTURING METHOD THEREOF INCLUDING CONTACT HOLES OPTIMIZED TO PREVENT EXCESS HYDROGEN FROM INTRODUCING INTO SEMICONDUCTOR LAYER

This application claims priority to Korean Patent Application No. 10-2020-0083521, filed on Jul. 7, 2020, and all the benefits accruing therefrom under 35 U.S.C. § 119, the content of which in its entirety is herein incorporated by reference.

BACKGROUND

(a) Field

The disclosure relates to a display device and a manufacturing method thereof, and more particularly, to a display device and a manufacturing method thereof that does not include a source electrode and a drain electrode disposed in a same layer as a data line.

(b) Description of the Related Art

Among display devices, a flat panel display device has been spotlighted due to desired characteristics such as light weight and thin thickness. Among flat panel display devices, a light emitting display device is a self-emissive display device that displays an image by using a light emitting diode that emits light without using a separate light source. In addition, the light emitting display device has attracted attention as a next-generation display device due to various desired characteristics such as low power consumption, high luminance, and high reaction speed.

Such a light emitting display device typically includes a plurality of pixels including a light emitting diode, a plurality of transistors for driving the light emitting diode, and at least one capacitor.

SUMMARY

In a light emitting display device, an oxide semiconductor may be used as a semiconductor layer of the transistor. In such a light emitting display device, it is desired to reduce the number of masks used in a manufacturing process to simplify the process.

Embodiments of the invention relate to a display device and a manufacturing method thereof that may stably maintain performance of a transistor including an oxide semiconductor.

An embodiment of the invention provides a display device including: a substrate; a first semiconductor layer disposed on the substrate, where the first semiconductor layer includes a channel region and a doped region; a first gate electrode disposed to overlap the channel region of the first semiconductor layer; an intermediate film disposed on the first semiconductor layer and the first gate electrode; and a first electrode disposed on the intermediate film, where an opening is defined through the intermediate film to overlap the doped region of the first semiconductor layer, the doped region of the first semiconductor layer and the first electrode contacts each other through the opening of the intermediate film, and an area of a cross-section of the opening of the intermediate film parallel to the substrate is in a range of about 49 square micrometers ($\mu m^2$) to about 81 $\mu m^2$.

In an embodiment, the first semiconductor layer may include an oxide semiconductor.

In an embodiment, the intermediate film may include a silicon nitride.

In an embodiment, the display device may further include an insulating film disposed between the intermediate film and the first electrode, where an entire region of the intermediate film may contact the insulating film, and the insulating film may include an organic material.

In an embodiment, the display device may further include: a light blocking layer disposed between the substrate and the first semiconductor layer; and a buffer layer disposed between the light blocking layer and the first semiconductor layer, where an opening may be defined through the buffer layer to overlap the light blocking layer, and the first electrode and the light blocking layer may contact each other through the opening of the buffer layer.

In an embodiment, the display device may further include: a second semiconductor layer disposed in a same layer as the first semiconductor layer, where the second semiconductor layer may include a channel region and a doped region; and a first connection electrode disposed in a same layer as the first electrode, where the first connection electrode may contact the first gate electrode and the doped region of the second semiconductor layer, and may connect the first gate electrode and the second semiconductor layer to each other.

In an embodiment, the display device may further include: a data line disposed in a same layer as the light blocking layer; and a second connection electrode disposed in a same layer as the first electrode, where the second connection electrode may contact the data line and the doped region of the second semiconductor layer, and may connect the data line and the second semiconductor layer to each other.

In an embodiment, a shape of a cross-section of the opening of the intermediate film parallel to the substrate may be one selected from a polygonal shape, a circular shape, an elliptical shape, and a shape including a plurality of sides and curved lines connecting the sides to each other.

In an embodiment, a threshold voltage of the first semiconductor layer may be in a range of about −1.0 volt (V) to 1.0 V.

Another embodiment of the invention provides a display device including: a substrate; a first semiconductor layer disposed on the substrate, where the first semiconductor layer includes a channel region and a doped region; a first gate electrode disposed to overlap the channel region of the first semiconductor layer; an intermediate film disposed on the first semiconductor layer and the first gate electrode; and a first electrode disposed on the intermediate film, where an opening is defined through the intermediate film to overlap the doped region of the first semiconductor layer, the doped region of the first semiconductor layer and the first electrode contact each other through the opening, the first semiconductor layer includes an oxide semiconductor, the intermediate film includes a silicon nitride, and a width of the opening is in a range of about 7 micrometers ($\mu m$) to about 9 $\mu m$.

In an embodiment, a shape of a cross-section of the opening parallel to the substrate may be one selected from a polygonal shape, a circular shape, an elliptical shape, and a shape including a plurality of sides and curved lines connecting the sides to each other, where the width of the opening may be a length of a longest side when the cross-section of the opening is a polygon or the shape including the plurality of sides and the curved lines connecting the sides to each other, the width of the opening may be a length of a diameter when the cross-section of the opening is circular, and the width of the opening may be a length of a long axis when the cross-section of the opening is elliptical.

In an embodiment, the display device may further include: a second semiconductor layer disposed in a same layer as the first semiconductor layer and including a channel region and a doped region; and a first connection electrode disposed in a same layer as the first electrode, where the first connection electrode may contact the first gate electrode and the doped region of the second semiconductor layer, and may connect the first gate electrode and the second semiconductor layer to each other.

In an embodiment, the display device may further include: a data line disposed between the substrate and the second semiconductor layer; a buffer layer disposed between the data line and the second semiconductor layer; and a second connection electrode disposed in a same layer as the first electrode, wherein the second connection electrode may contact the data line and the doped region of the second semiconductor layer, and may connect the data line and the second semiconductor layer to each other.

In an embodiment, a threshold voltage of the first semiconductor layer may be in a range of about −1.0 V to about 1.0 V.

Another embodiment of the invention provides a manufacturing method of a display device, the manufacturing method including: providing a first semiconductor layer and a second semiconductor layer on a substrate; providing a gate insulating film and a gate electrode on the first semiconductor layer and the second semiconductor layer, respectively; depositing an intermediate film and an insulating film over the first semiconductor layer, the second semiconductor layer, the gate insulating film and the gate electrode, and then etching them to form an opening overlapping the first semiconductor layer and the second semiconductor layer, respectively; plasma-treating the opening; and providing a first electrode on the insulating film, wherein the first electrode may contact the first semiconductor layer through the opening, and an area of a cross-section of the opening parallel to the substrate is in a range of about 49 μm$^2$ to about 81 μm$^2$.

In an embodiment, the first semiconductor layer and the second semiconductor layer may include an oxide semiconductor, and the intermediate film may include a silicon nitride.

In an embodiment, a shape of a cross-section of the opening parallel to the substrate may be one selected from a polygonal shape, a circular shape, an elliptical shape, and a shape including a plurality of sides and curved lines connecting the sides to each other.

In an embodiment the plasma-treating the opening may include performing the plasma-treating for 30 seconds to 90 seconds with a power in a range of 1.5 kilowatts (kW) to 2.5 kW.

In an embodiment, the manufacturing method may further include providing a first connection electrode on the insulating film during a same process as the first electrode, where the first connection electrode may contact the gate electrode overlapping the first semiconductor layer and the second semiconductor layer, respectively, and the first connection electrode may connect the gate electrode and the second semiconductor layer to each other.

In an embodiment, the manufacturing method may further include: providing a light blocking layer and a data line on the substrate before the providing the first semiconductor layer and the second semiconductor layer on the substrate; providing a buffer layer over the light blocking layer and the data line before the providing the first semiconductor layer and the second semiconductor layer on the substrate; and providing a second connection electrode on the insulating film during a same process as the first electrode, where the second connection electrode may contact the data line and the second semiconductor layer, respectively, and may connect the data line and the second semiconductor layer to each other.

According to embodiments of the display device and the manufacturing method, it is possible to stably maintain performance of a transistor including an oxide semiconductor.

DETAILED DESCRIPTION

Figure 1:
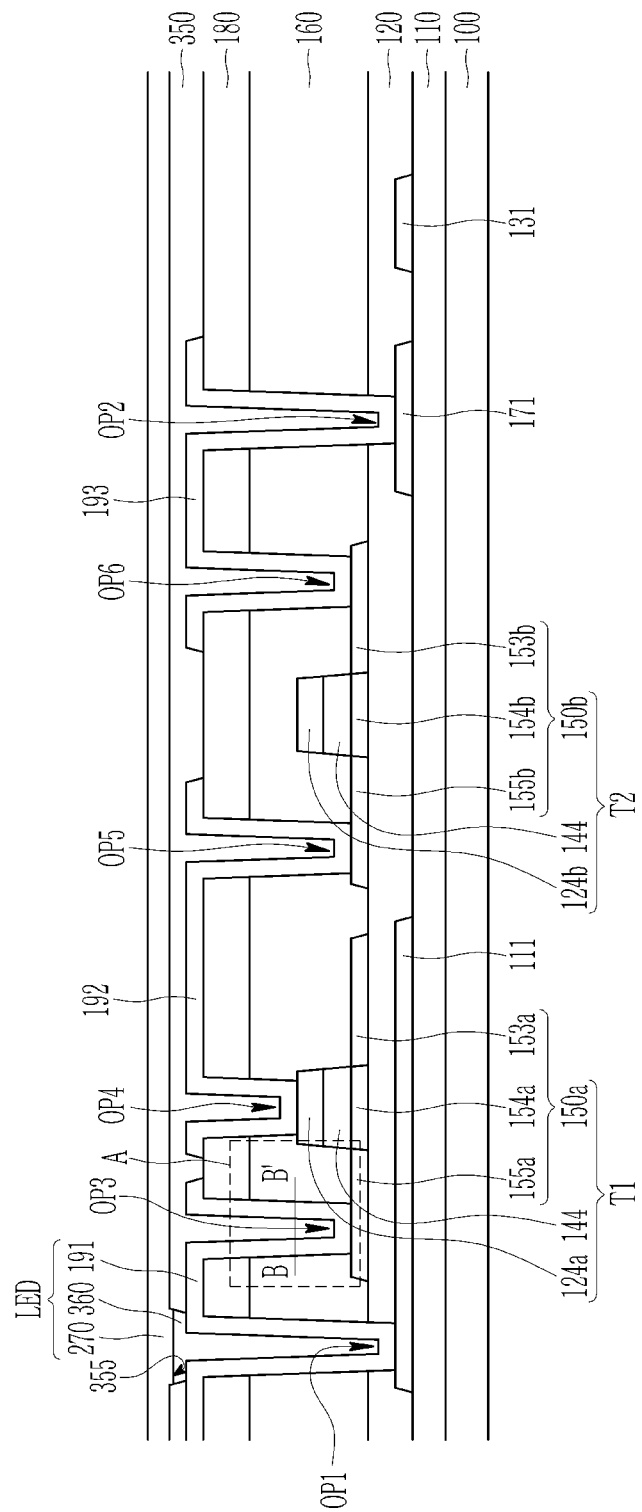
FIG. 1 is a cross-sectional view of a display device according to an embodiment of the invention.

The invention will now be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Parts that are irrelevant to the description will be omitted to clearly describe the disclosure, and like reference numerals designate like elements throughout the specification.

Further, in the drawings, the size and thickness of each element are arbitrarily illustrated for ease of description, and the disclosure is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, throughout the specification, the phrase "in a plan view" or "on a plane" means viewing a target portion from the top, and the phrase "in a cross-section" or "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a cross-sectional view of a display device according to an embodiment of the invention.

Referring to FIG. 1, an embodiment of a display device has a structure in that, instead of a source electrode and a drain electrode of a transistor, a first connection electrode 192 and a second connection electrode 193 are disposed in a same layer as a first electrode 191. In such an embodiment, as described above, by omitting the source electrode and the drain electrode and disposing the first connection electrode 192 and the second connection electrode 193, a mask used to form the source electrode and the drain electrode in a manufacturing process may be omitted, thereby simplifying the manufacturing process.

Hereinafter, a structure of an embodiment of the display device will be described in detail with reference to FIG. 1.

Referring to FIG. 1, in an embodiment of the display device, a barrier layer 110 is disposed on a substrate 100 including a transparent glass or plastic. The barrier layer 110 may include an inorganic material, and alternatively, the barrier layer 110 may be omitted.

In such an embodiment, a light blocking layer 111, a data line 171, and a storage electrode line 131 are disposed on the barrier layer 110. Since the light blocking layer 111, the data line 171, and the storage electrode line 131 are disposed in a same layer as each other, the light blocking layer 111, the data line 171, and the storage electrode line 131 may be formed in a same process, and may include a same material as each other. The light blocking layer 111 may be disposed to overlap a first transistor T1 and the substrate 100 in a vertical direction. The light blocking layer 111 may prevent external light from reaching channel regions 154a and 154b of semiconductor layers 150a and 150b, thereby reducing a leakage current and preventing deterioration of characteristics. As will be described in detail later, the light blocking layer 111 may be connected to the first electrode 191 at a first opening OP1 defined through a buffer layer 120. In such an embodiment, the data line 171 may also be connected to the second connection electrode 193 at a second opening OP2 defined through the buffer layer 120.

The buffer layer 120 is disposed on the light blocking layer 111, the data line 171, and the storage electrode line 131. The buffer layer 120 may insulate the semiconductor layers 150a and 150b from the light blocking layer 111, the data line 171, and the storage electrode line 131, and may include an organic material or an inorganic material. In one embodiment, for example, the buffer layer 120 may include an inorganic insulating material such as a silicon nitride (SiNx), a silicon oxide (SiOx), and a silicon oxynitride (SiON), or an organic insulating material, where x may be 1 to 4. In such an embodiment, the first opening OP1 overlapping the light blocking layer 111 and the second opening OP2 overlapping the data line 171 are defined through the buffer layer 120.

The semiconductor layers 150a and 150b are disposed on the buffer layer 120. The semiconductor layers 150a and 150b may include a first semiconductor layer 150a and a second semiconductor layer 150b. The first semiconductor layer 150a may form the first transistor T1, and the first transistor T1 may be a driving transistor. The second semiconductor layer 150b may form a second transistor T2, and the second transistor T2 may be a switching transistor.

The semiconductor layers 150a and 150b may include at least one selected from amorphous silicon, polycrystalline silicon, monocrystalline silicon, and an oxide semiconductor. In an embodiment, the semiconductor layers 150a and 150b may include oxide semiconductors. In one embodiment, for example, the semiconductor layers 150a and 150b may include an oxide semiconductor material containing at least one selected from zinc (Zn), indium (In), gallium (Ga), tin (Sn), and a combination thereof. In one embodiment, for example, the semiconductor layers 150a and 150b may include indium-gallium-zinc oxides ("IGZO").

The first semiconductor layer 150a includes a source region 153a, a drain region 155a, and a channel region 154a disposed between the source region 153a and the drain region 155a. The source region 153a and the drain region 155a are doped regions in which doping is performed.

In an embodiment, the second semiconductor layer 150b includes a source region 153b, a drain region 155b, and a channel region 154b disposed between the source region 153b and the drain region 155b.

The source region 153b and the drain region 155b are doped regions in which doping is performed.

In an embodiment, a gate insulating pattern 144 may be disposed to overlap the channel regions 154a and 154b of the semiconductor layers 150a and 150b. The gate insulating pattern 144 may not substantially overlap conductive regions of the semiconductor layers 150a and 150b.

Gate electrodes 124a and 124b may be disposed on the gate insulating pattern 144. The gate electrodes 124a and 124b may overlap the channel regions 154a and 154b of the semiconductor layers 150a and 150b in a direction perpendicular to the substrate 100. The first gate electrode 124a and the first semiconductor layer 150a form or collective define the first transistor T1, and the second gate electrode 124b and the second semiconductor layer 150b form or collective define the second transistor T2.

An intermediate film 160 and an insulating film 180 are disposed on the semiconductor layers 150a and 150b and the gate electrodes 124a and 124b. The intermediate film 160 may be an inorganic film including an inorganic material, and the insulating film 180 may include an organic material. The intermediate film 160 may protect the transistor T1 from external moisture. The intermediate film 160 may include at least one selected from a silicon nitride (SiNx), a silicon oxide (SiOx), and a silicon oxynitride (SiON), where x is 1 to 4. In one embodiment, for example, the intermediate film 160 may include a SiNx. In such an embodiment, penetration of moisture into an element may be effectively prevented by the intermediate film 160 since SiNx effectively blocks external moisture. However, a hydrogen content of SiNx is high, which may affect semiconductor properties of the semiconductor layers 150a and 150b. This will be described later in greater detail.

In an embodiment, a third opening OP3 is defined through the intermediate film 160 and the insulating film 180 to overlap the drain region 155a of the first semiconductor layer 150a, a fourth opening OP4 is defined through the intermediate film 160 and the insulating film 180 to overlap the first gate electrode 124a, a fifth opening OP5 is defined through the intermediate film 160 and the insulating film 180 to overlap the drain region 155b of the second semiconductor layer 150b, and a sixth opening OP6 is defined through the intermediate film 160 and the insulating film 180 to overlap the source region 153b of the second semiconductor layer 150b. In such an embodiment, the first opening OP1 and the second opening OP2 is defined in the buffer layer 120 through the intermediate film 160 and the insulating film 180.

In an embodiment, the third opening OP3, the fifth opening OP5, and the sixth opening OP6 are openings defined to overlap or expose the first semiconductor layer 150a and the second semiconductor layer 150b. In such an embodiment, an area in a direction parallel to the substrate 100 (or a cross-sectional area) of the third opening OP4, the fifth opening OP5, and the sixth opening OP6 disposed to overlap the first semiconductor layer 150a and the second semiconductor layer 150b may be in a range of about 49 square micrometers ($\mu m^2$) to about 81 $\mu m^2$. In such an embodiment, a width of the third opening OP4, the fifth opening OP5, and the sixth opening OP6 may be in a range of about 7 micrometers ($\mu m$) to about 9 $\mu m$. A measurement standard of the term "width" used herein will be described in detail with reference to FIG. 8 to FIG. 13. In an embodiment, where the opening is rectangular, a length of a longest side is a width. In an alternative embodiment, where the opening is circular, a length of a diameter is a width. In another alternative embodiment, where the opening is elliptical, a length of a largest diameter is a width.

In a case where the cross-sectional area or the width of the third opening OP4, the fifth opening OP5, and the sixth opening OP6 is too large, since the intermediate film (SiNx) contains an high amount of hydrogen, the hydrogen contained in the intermediate film may penetrate into the semiconductor layers 150a and 150b such that the semiconductor layers 150a and 150b function as conductors, as will be described later. As will be described separately later, cross-sections of the third opening OP4, the fifth opening OP5, and the sixth opening OP6 may be variously modified, such as square, rectangular, quadrangular, circular, and elliptical. Regardless of the shape of the opening, when the opening is quadrangular, a length of a longest side may be in a range of about 7 $\mu m$ to about 9 $\mu m$, when the opening is circular, a length of a diameter may be in a range of about 7 $\mu m$ to about 9 $\mu m$, and when the opening is elliptical, a length of a largest diameter may be in a range of about 7 $\mu m$ to about 9 $\mu m$.

Referring back to FIG. 1, the first electrode 191, the first connection electrode 192, and the second connection electrode 193 are disposed on the insulating film 180. The first electrode 191, the first connection electrode 192, and the second connection electrode 193 may include a transparent conductive oxide, may be formed in a same process, and may include a same material as each other. In one embodiment, for example, it may include a multi-layered structure of indium tin oxide ("ITO")/Ag/ITO.

The second connection electrode 193 is connected to the data line 171 through the second opening OP2, and is connected to the source region 153b of the second transistor T2 through the sixth opening OP6. In such an embodiment, the second connection electrode 193 connects the data line 171 and the source region 153b of the second transistor T2 to each other.

The first connection electrode 192 is connected to the drain region 155b of the second transistor T2 through the fifth opening OP5, and is connected to the first gate electrode 124a of the first transistor T1 through the fourth opening OP4. In such an embodiment, the first connection electrode 192 connects the drain region 155b of the second transistor T2 and the first gate electrode 124a of the first transistor T1 to each other.

The first electrode 191 is connected to the drain region 155a of the first transistor T1 through the third opening OP3 to receive a voltage. The first electrode 191 may also be connected to the light blocking layer 111 through the first opening OP1, and may constantly maintain a current according to a voltage.

A partition wall 350 is disposed on the first electrode 191, the first connection electrode 192, and the second connection electrode 193. In an embodiment, an opening 355 is defined through the partition wall 350 to overlap or expose the first electrode 191. A light emitting layer 360 may be disposed in the opening 355. A second electrode 270 is disposed on the light emitting layer 360 and the partition wall 350. The first electrode 191, the light emitting layer 360, and the second electrode 270 may form a light emitting diode LED.

In an embodiment, as shown in FIG. 1, the display device does not include a source electrode or a drain electrode disposed in a same layer as the data line 171, and the source electrode or the drain electrode receives a data voltage through the first connection electrode 192 and the second connection electrode 193. In such an embodiment, separate source and drain electrodes in a same layer as the data line 171 are not included, the number of masks may be reduced in a manufacturing process, thereby effectively reducing the cost of the manufacturing process.

In an embodiment, since the intermediate film 160 includes SiNx, the transistor is effectively protected from external moisture. However, in a case where the intermediate film 160 includes SiNx, since SiNx contains excessive hydrogen, the semiconductor layers 150a and 150b may act like conductors by the hydrogen. In an embodiment of the invention, the cross-sectional area of the opening overlapping the semiconductor layers 150a and 150b is in a range of about 49 $\mu m^2$ to about 81 $\mu m^2$, and plasma treatment is performed in the manufacturing process, thus the hydrogen inside the semiconductor layers 150a and 150b is removed such that the semiconductor layers 150a and 150b normally operate.

Hereinafter, effects of embodiments of the invention will be described in detail.

Figure 2:
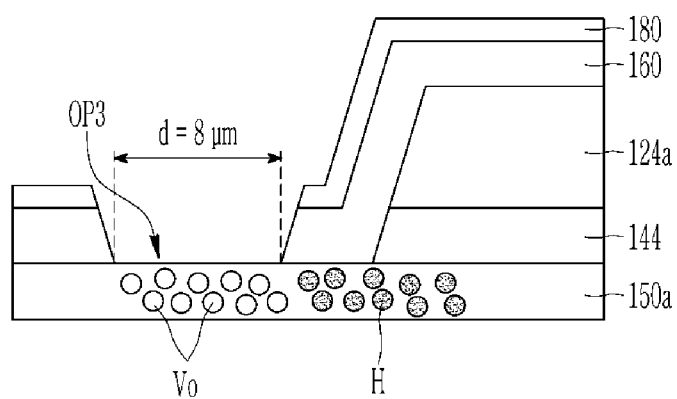
FIG. 2 and FIG. 3 illustrate enlarged cross-sectional views of a portion "A" in FIG. 1.
Figure 3:
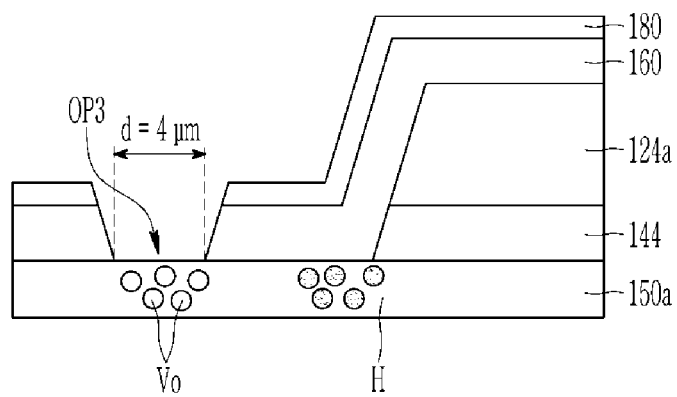

FIG. 2 and FIG. 3 illustrate enlarged cross-sectional views of portion "A" in FIG. 1. Referring to FIG. 2, a width (d) of the third opening OP3 in FIG. 2 is 8 µm, and a width (d) of the third opening OP3 in FIG. 3 is 4 µm. For better comprehension and ease of description, FIG. 2 and FIG. 3 show hydrogen atoms (H) and vacancies (Vo) inside the first semiconductor layer 150a.

In both FIG. 2 and FIG. 3, since the intermediate film 160 includes SiNx, hydrogen atoms are introduced into the semiconductor layer 150a. When a hydrogen content is increased inside the semiconductor layer 150a, an n+ region of an oxide semiconductor increases, and an effective channel length decreases due to the increase of the n+ region of the oxide semiconductor. Therefore, the semiconductor layer 150a may function as a conductor.

Figure 4:
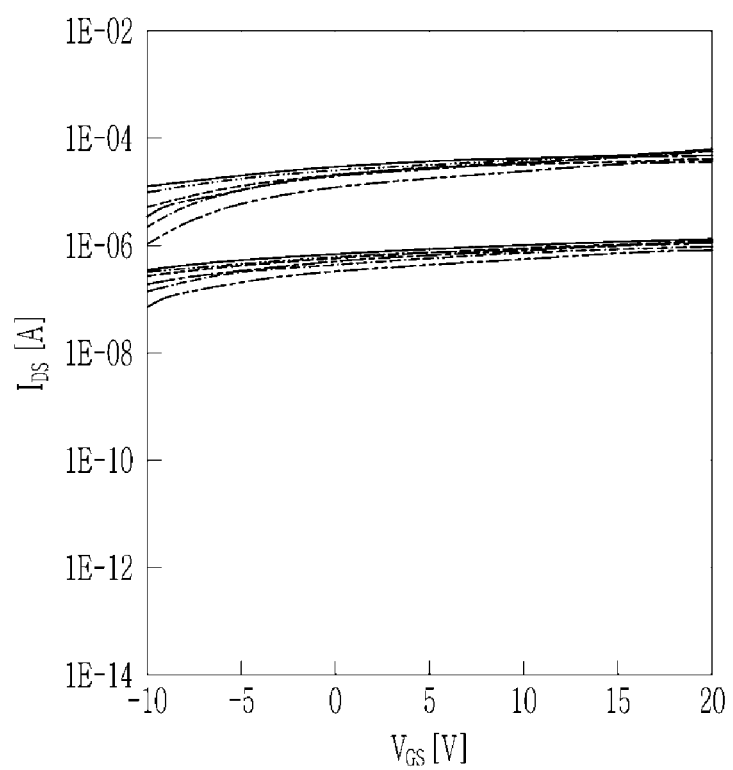
FIG. 4 and FIG. 5 illustrate graphs in which voltage-current is measured for an element of a display device having a conductor characteristic as an n+ region of an oxide semiconductor increases.
Figure 5:
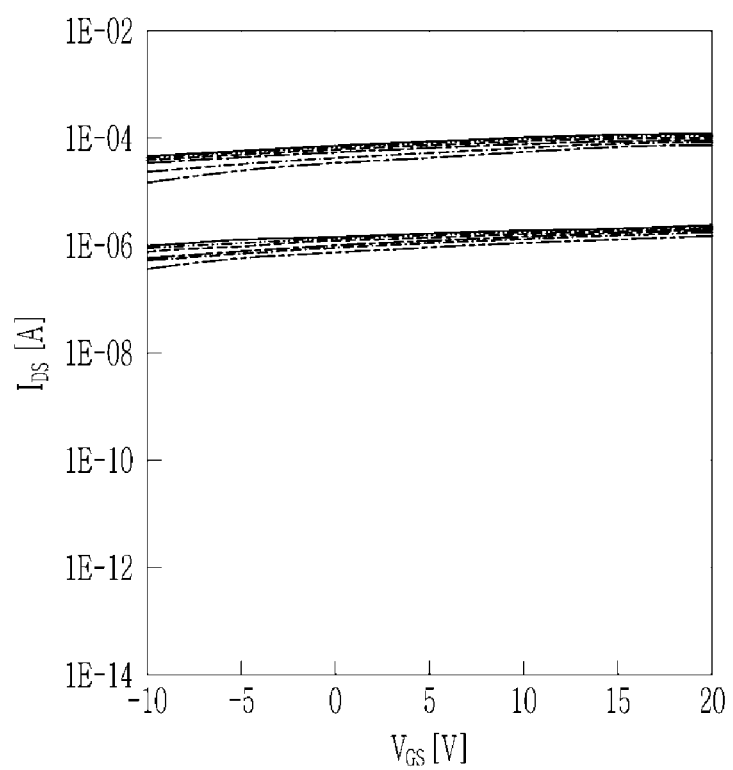

FIG. 4 and FIG. 5 illustrate graphs in which voltage-current is measured for an element of a display device having a conductor characteristic as an n+ region of an oxide semiconductor increases. FIG. 4 and FIG. 5 illustrate results of repeated experiments, and in this case, results measured several times are shown in one graph. FIG. 4 illustrates a graph of results in which currents according to voltages are measured in a first transistor (driving transistor), and FIG. 5 illustrates a graph of results in which currents according to voltages are measured in a second transistor (switching transistor). Referring to FIG. 4 and FIG. 5, it can be confirmed that hydrogen contained in SiNx included in the intermediate film was introduced into the oxide semiconductor layer, and accordingly, as the n+ region of the oxide semiconductor increased, the effective channel was shortened, and thus the transistor did not normally function. That is, no threshold voltage exists in the graph.

Figure 6:
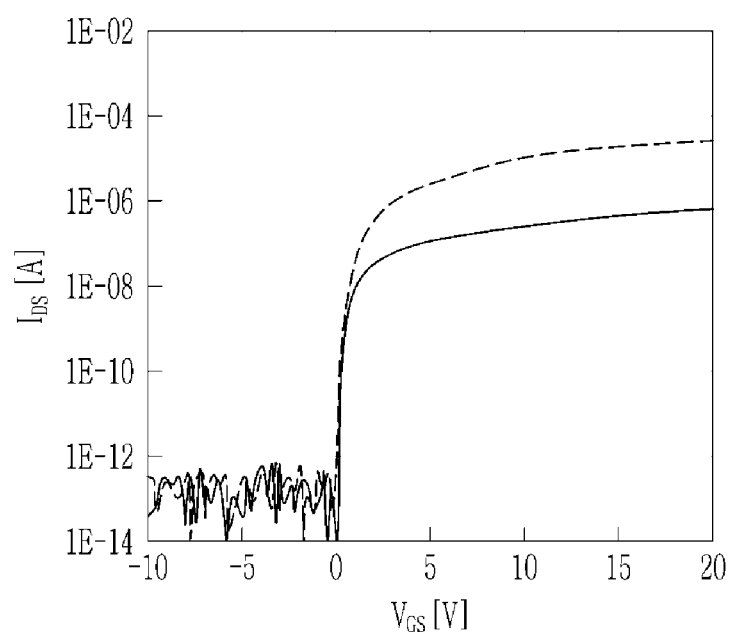
FIG. 6 illustrates a result of measuring voltage and current in the embodiment of FIG. 2.
Figure 7:
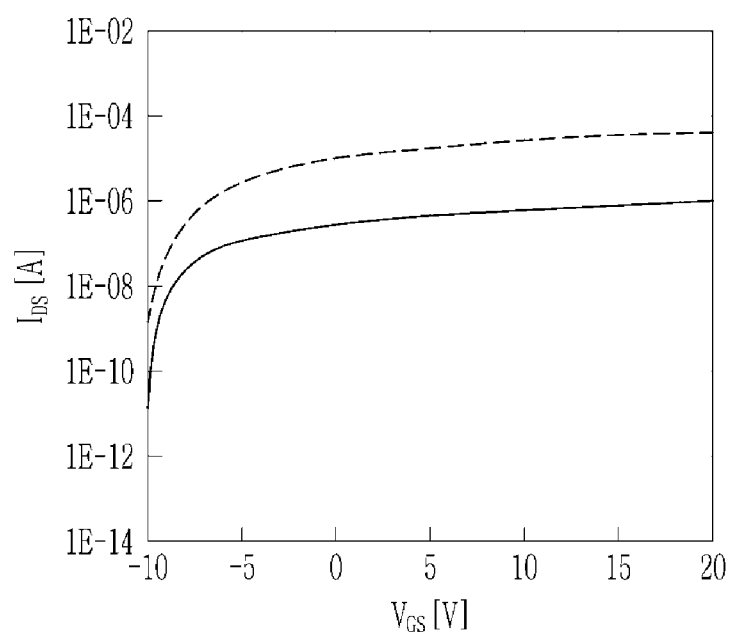
FIG. 7 illustrates a result of measuring voltage and current in the embodiment of FIG. 3.

FIG. 6 illustrates a result of measuring voltage and current in the embodiment of FIG. 2, and FIG. 7 illustrates a result of measuring voltage and current in the embodiment of FIG. 3. Referring to FIG. 6 and FIG. 7, it can be confirmed that in the case of FIG. 7 in which the width of the opening OP3 was 4 µm, the threshold voltage was lower than −10 volt (V), but in the case of FIG. 6 in which the width of the opening OP3 was 8 µm, the threshold voltage was about −1.0 V that was higher than that of FIG. 7.

Referring to FIG. 2, FIG. 3, FIG. 6, and FIG. 7, it is shown that the threshold voltage increases as the width of the third opening OP3 increases. Accordingly, an increase in conductor properties of the semiconductor layer due to hydrogen contained in the intermediate film 160 including SiNx may be effectively prevented by controlling the width of an opening that exposes the semiconductor layer.

In such an embodiment, the larger the area of the third opening OP3 overlapping the semiconductor layer 150a, the higher the vacancy concentration of the semiconductor layer 150a by the plasma treatment during the manufacturing process, and the increased vacancy is combined with a hydrogen ion to remove the hydrogen ion.

That is, when comparing FIG. 2 and FIG. 3, it can be seen that there are more vacancies Vo in FIG. 3 in which the third opening OP3 has a larger area. This is because the area in which the inert gas collides during plasma processing increases as the area of the third opening OP3 is wider, and the vacancies occur inside the semiconductor layer 150a due to the collision. Since the vacancies are bonded to hydrogen ions inside the semiconductor layer 150a, excess hydrogen is removed, and accordingly, the semiconductor layer 150a may be effectively prevented from having conductor characteristics due to hydrogen introduced from the intermediate film 160 including SiNx.

In such an embodiment, shapes of the openings overlapping the semiconductor layers 150a and 150b may vary. FIG. 8 to FIG. 13 illustrate cross-sectional views taken along line B-B' of FIG. 1. In FIG. 8 to FIG. 13, the third opening OP3 is shown for convenience of illustration and description, but the following description may be commonly applied to the openings overlapping the semiconductor layers 150a and 150b, that is, the fifth opening OP5 and the sixth opening OP6.

Hereinafter, various shapes of the openings overlapping the semiconductor layers 150a and 150b and measurement criteria of the widths d in the openings having the respective shapes will be described in detail with reference to FIG. 8 to FIG. 13.

Figure 8:
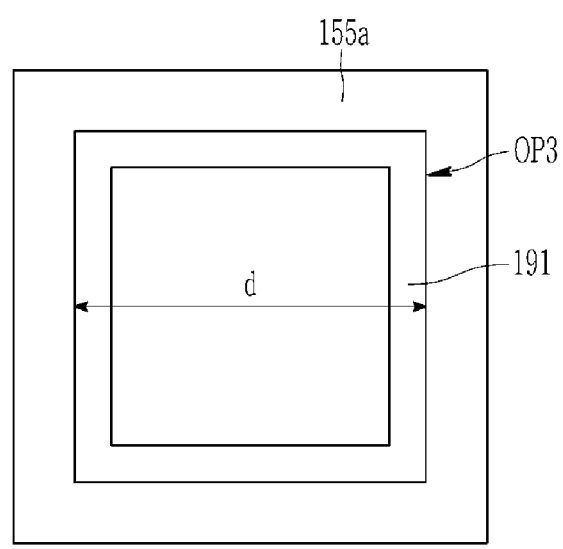
FIG. 8 to FIG. 13 illustrate cross-sectional views taken along line B-B' of FIG. 1.

Referring to FIG. 8, in an embodiment, the shape of the third opening OP3 may be square. In such an embodiment, the width (d) of the third opening OP3 is the same as the length of one side of the square. That is, when the shape of the third opening OP3 is square, the width (d) of the opening means the length of one side of the third opening OP3 as shown in FIG. 8. In such an embodiment, an area of the third opening OP3 in a direction parallel to the substrate 100 may be in a range of about 49 µm² to about 81 µm².

Figure 9:
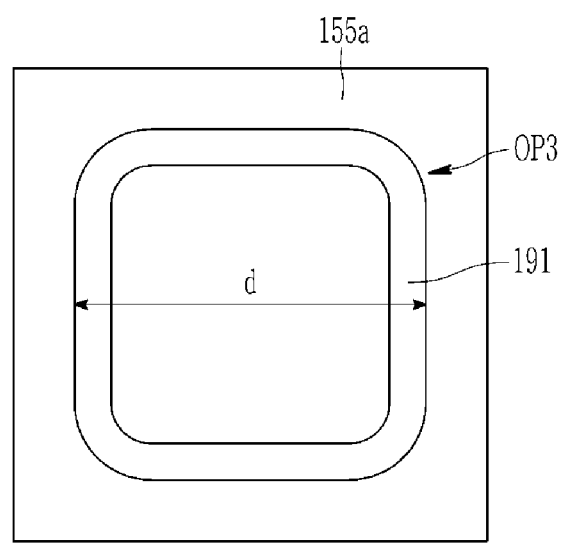

Referring to FIG. 9, in an alternative embodiment, the shape of the third opening OP3 may be a square-like shape in which four corners are rounded. This is a shape that may be formed in a manufacturing process, and when the shape of the third opening OP3 is a square-like shape having four rounded corners, as shown in FIG. 9, the width (d) of the opening described herein means a length of a longest part of the third opening OP3. In such an embodiment, an area of the third opening OP3 in a direction parallel to the substrate 100 may be in a range of about 49 µm² to about 81 µm².

Figure 10:
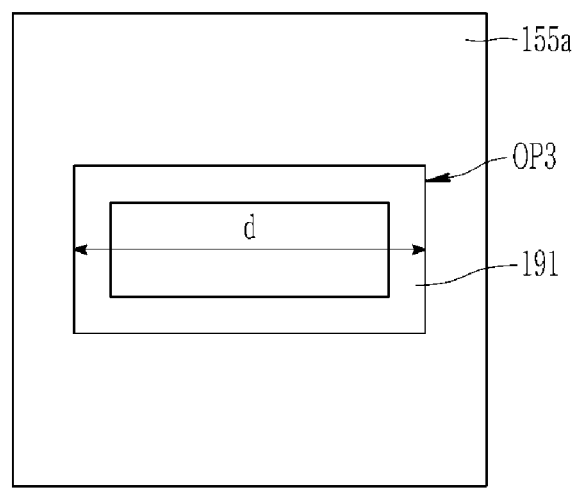

Referring to FIG. 10, in another alternative embodiment, the shape of the third opening OP3 may be rectangular. In such an embodiment, the width of the third opening OP3 is a length of a long side of the rectangle, that is, when the shape of the third opening OP3 is rectangular, as shown in FIG. 10, the width (d) of the opening means the length of the long side. In such an embodiment, an area of the third opening OP3 in a direction parallel to the substrate 100 may be in a range of about 49 µm² to about 81 µm².

Figure 11:
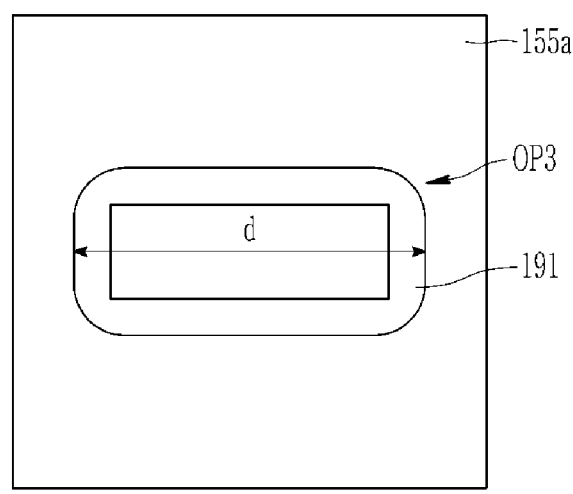

Referring to FIG. 11, in another alternative embodiment, the shape of the third opening OP3 may be a rectangle-like shape in which four corners are rounded. This is a shape that may be formed in a manufacturing process, and when the shape of the third opening OP3 is a rectangle-like shape having four rounded corners, as shown in FIG. 11, the width (d) of the opening means a length of a longest part of the third opening OP3. In such an embodiment, an area of the third opening OP3 in a direction parallel to the substrate 100 may be in a range of about 49 µm² to about 81 µm².

Figure 12:
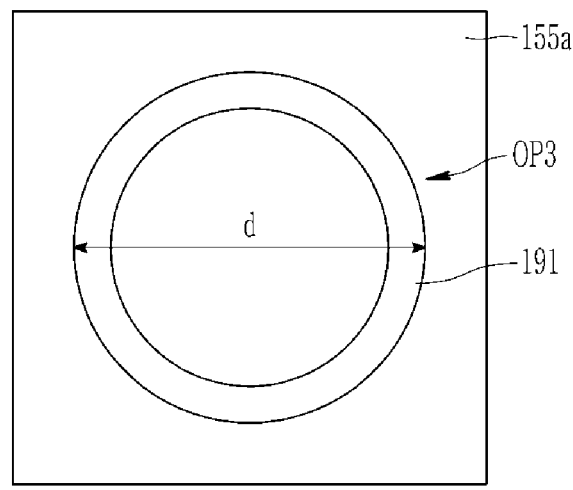

Referring to FIG. 12, in another alternative embodiment, the shape of the third opening OP3 may be circular. When the shape of the third opening OP3 is circular, the width (d) of the opening described in the specification means a diameter of the third opening OP3 as shown in FIG. 12. In such an embodiment, an area of the third opening OP3 in a direction parallel to the substrate 100 may be in a range of about 49 µm² to about 81 µm².

Figure 13:
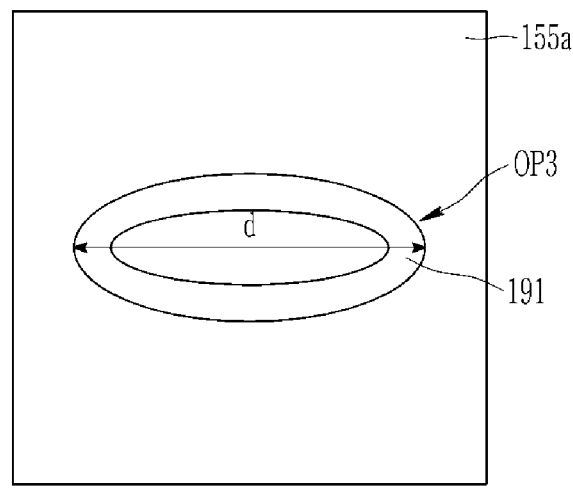
Figure 14:
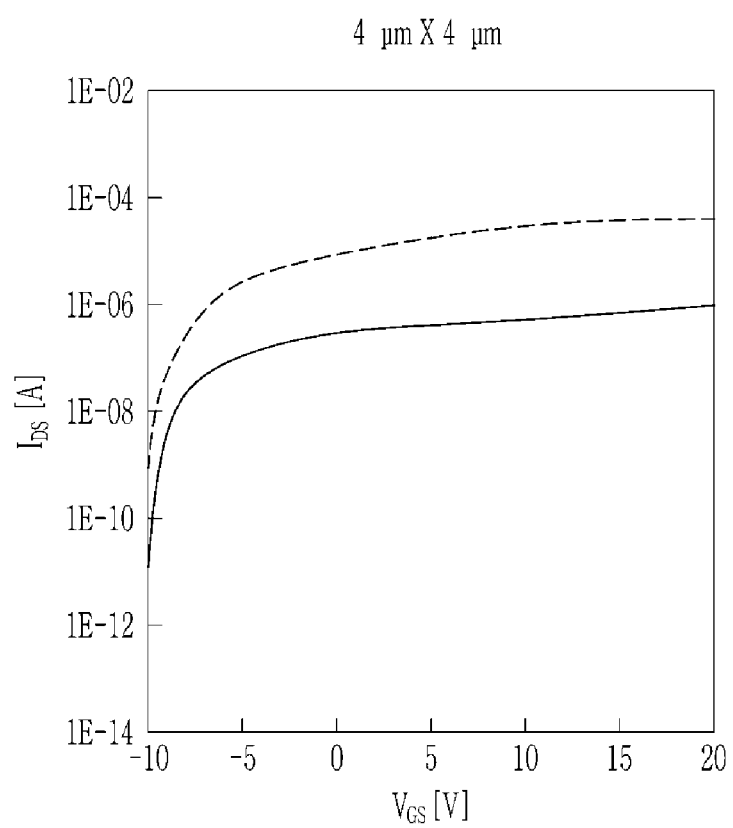
FIG. 14 to FIG. 19 illustrate results of measuring voltage-current while varying a size of an opening.
Figure 15:
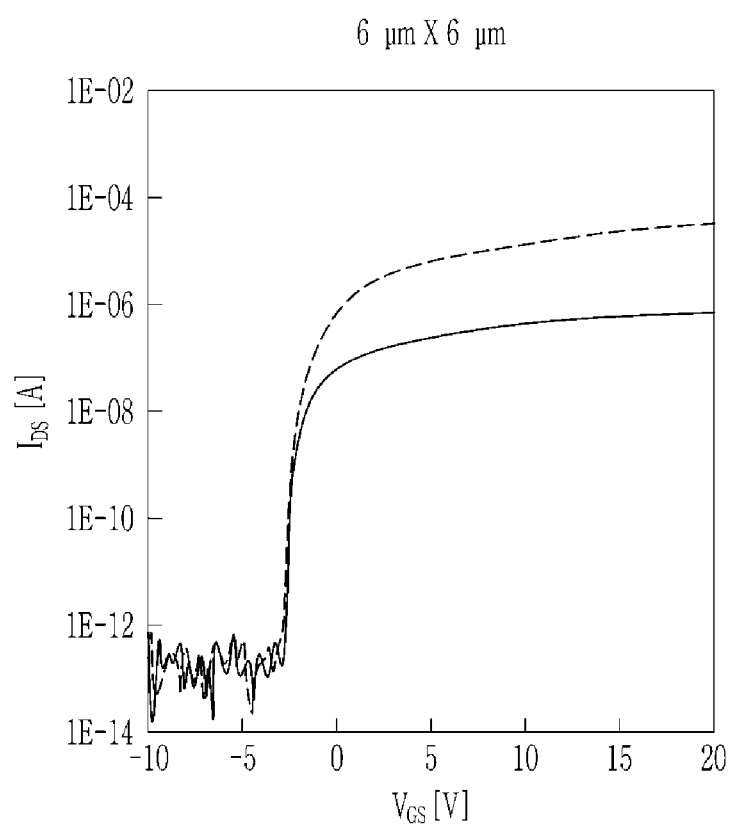
Figure 16:
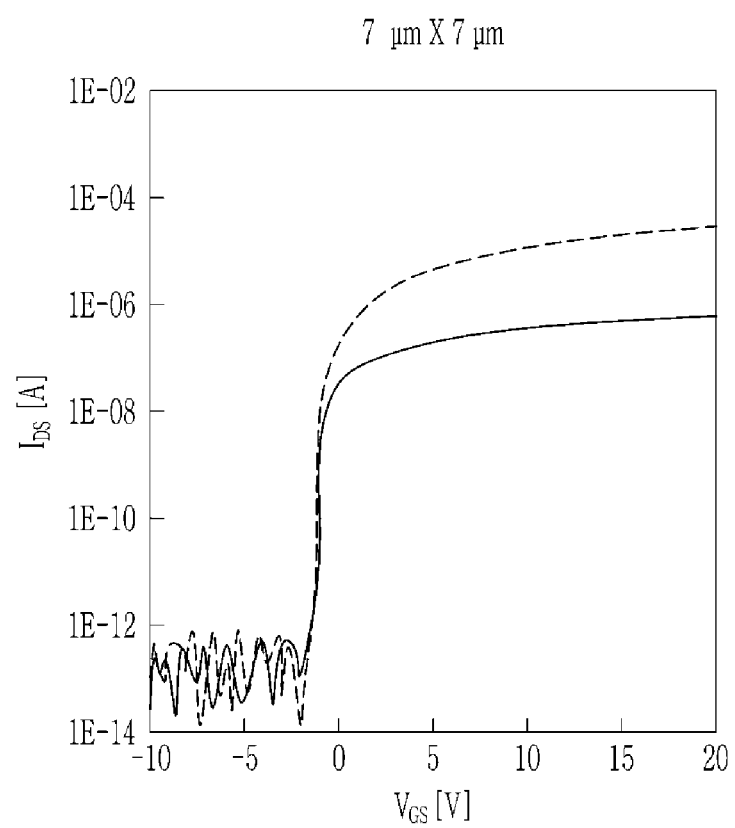
Figure 17:
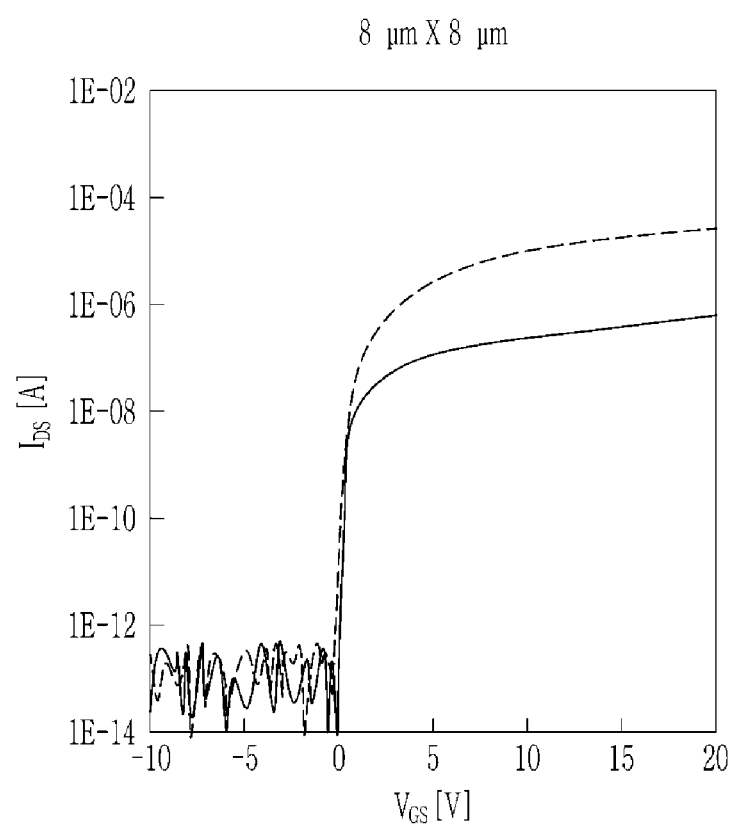
Figure 18:
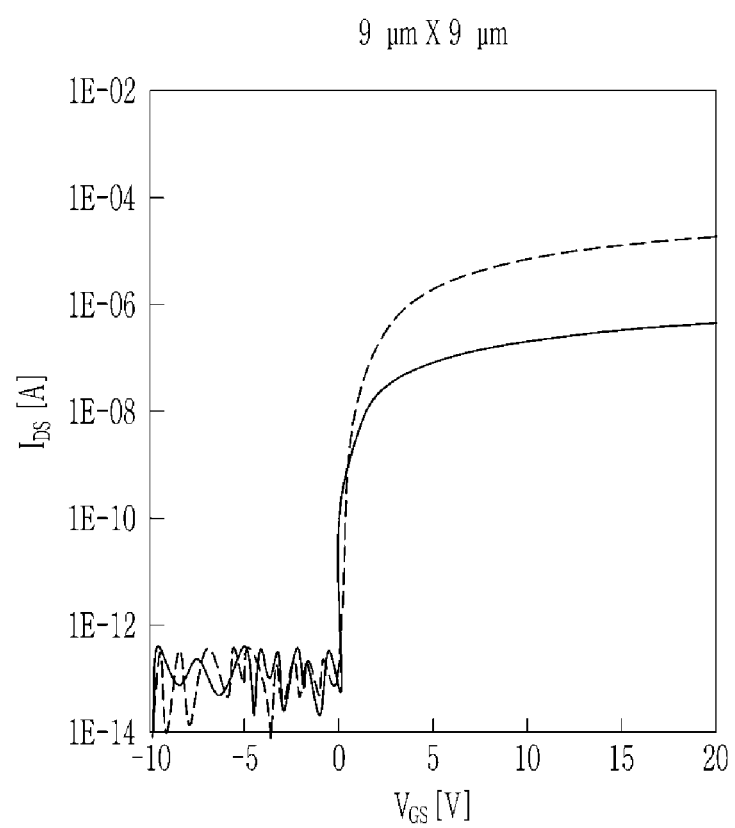
Figure 19:
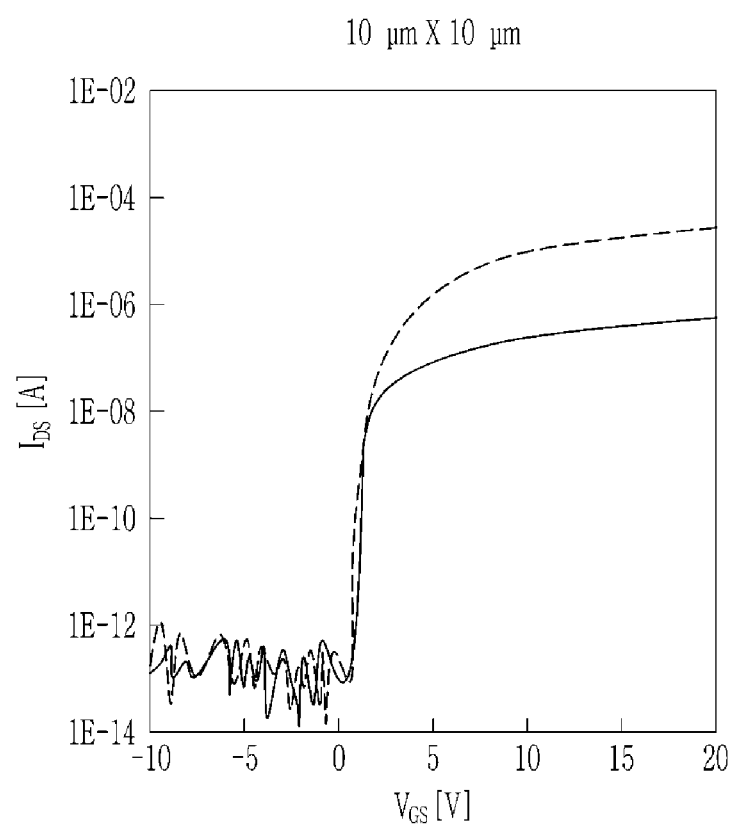

Referring to FIG. 13, in another alternative embodiment, the shape of the third opening OP3 may be elliptical. When the shape of the third opening OP3 is elliptical, the width (d) of the opening described in the specification means a diameter of a long axis of the third opening OP3 as shown in FIG. 12. In such an embodiment, an area of the third opening OP3 in a direction parallel to the substrate 100 may be in a range of about 49 µm² to about 81 µm².

Although various shapes of the third opening OP3 have been described above, the shape of the third opening OP3 is not limited thereto, and the third opening OP3 may have one of other various shapes. In an embodiment, the opening may be a polygon, a circle, an ellipse, or a shape including a plurality of sides and a curved surface connecting the sides to each other. In such an embodiment, the area of the third opening OP3 may be in a range of about 49 µm² to about 81 µm².

In an embodiment of the invention, the width of the opening overlapping the semiconductor layers 150a and 150b may be in a range of about 7 µm to about 9 µm. In such an embodiment, the area of the opening overlapping the semiconductor layers 150a and 150b may be in a range of about 49 µm² to about 81 µm².

In an embodiment, when the width of the opening overlapping the semiconductor layers 150a and 150b is less than about 7 µm or the area of the opening is less than about 49 µm², the hydrogen introduced into the semiconductor layers 150a and 150b may not be sufficiently removed, and thus the transistor may not normally operate.

In such an embodiment, when the width of the opening overlapping the semiconductor layers 150a and 150b exceeds about 9 µm or the area of the opening exceeds about 81 µm², the hydrogen in the semiconductor layers 150a and 150b is excessively removed, and thus the positive shift of the threshold voltage excessively occurs, and it may not be utilized as an element.

A range of the threshold voltage for the transistor of the display device to normally operate is between −1.0 V and 1.0 V.

FIG. 14 to FIG. 19 illustrate results of measuring voltage ($V_{GS}$)-current (Iips) while varying a size of an opening.

Table 1 shows mobilities and threshold voltages measured by experiments of FIG. 14 to FIG. 19.

TABLE 1

| Size of opening (µm × µm) | Mobility | Threshold voltage (Vth) |
| --- | --- | --- |
| 4 × 4 | — | −9.58 |
| 6 × 6 | 13.76 | −2.00 |
| 7 × 7 | 11.05 | −0.63 |
| 8 × 8 | 11.49 | 0.59 |
| 9 × 9 | 10.38 | 0.90 |
| 10 × 10 | 8.89 | 1.53 |

Referring to FIG. 14 to FIG. 19 and Table 1, it is shown that the threshold voltage was in a range of −1.0 V to 1.0 V when the size of the opening was between 7 µm×7 µm to 9 µm×9 µm. That is, when the size of the opening is less than 7 µm×7 µm, the threshold voltage may be a reference value or less that may normally operate as a transistor. In addition, when the size of the opening is more than 9 µm×9 µm, the threshold voltage is excessively high, so it may be effectively utilized as an element.

Hereinafter, a manufacturing method of the display device according to an embodiment of the invention will be described with reference to FIG. 20 to FIG. 28. FIG. 20 to FIG. 28 illustrate cross-sectional views of a manufacturing process according to an embodiment of the invention.

Figure 20:
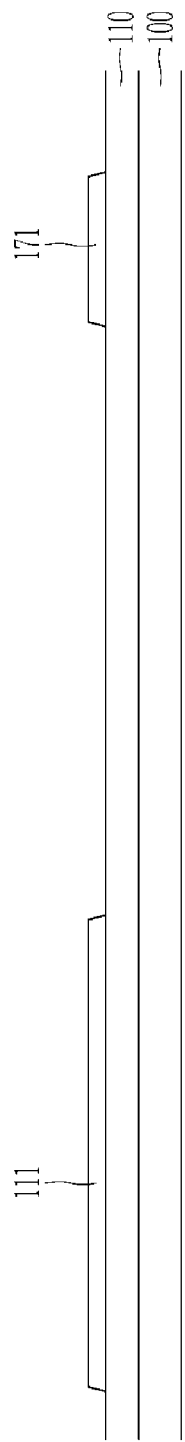
FIG. 20 to FIG. 28 illustrate cross-sectional views of a manufacturing process according to an embodiment of the invention.

Referring first to FIG. 20, the barrier layer 110 is provided or formed on the substrate 100, and the light blocking layer 111 and the data line 171 are provided or formed on the barrier layer 110. The light blocking layer 111 and the data line 171 may be formed in a same process as each other, and may include a same material as each other. In such a process, a first mask may be used.

Figure 21:
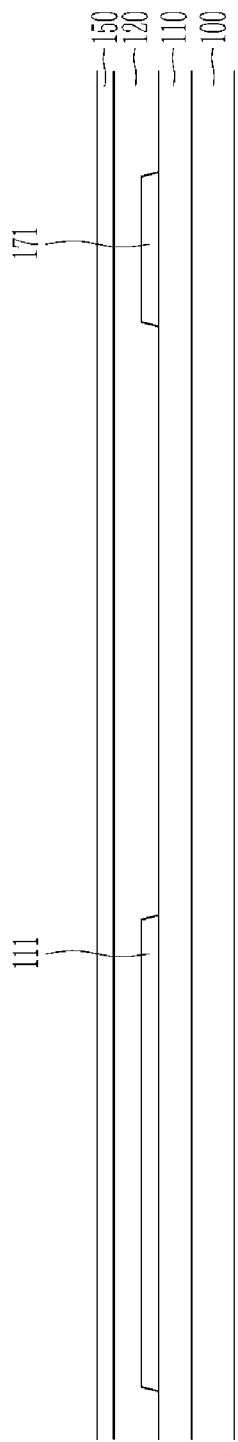

Next, referring to FIG. 21, the buffer layer 120 and a semiconductor layer 150 may be provided or formed on the light blocking layer 111 and the data line 171. The semiconductor layer 150 may include an oxide semiconductor. In one embodiment, for example, the semiconductor layer 150 may include an oxide semiconductor material including at least one selected from zinc (Zn), indium (In), gallium (Ga), tin (Sn), and a combination thereof. In one embodiment, for example, the semiconductor layers 150a and 150b may include IGZO.

Figure 22:
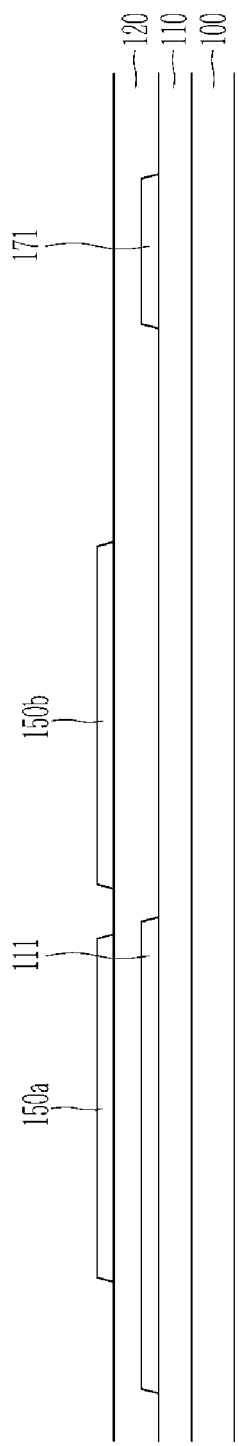

Next, referring to FIG. 22, the semiconductor layer 150 is etched to form the first semiconductor layer 150a and the second semiconductor layer 150b. In this process, a second mask may be used. Then, the first semiconductor layer 150a may form the first transistor T1, and the second semiconductor layer 150b may form the second transistor T2.

Figure 23:
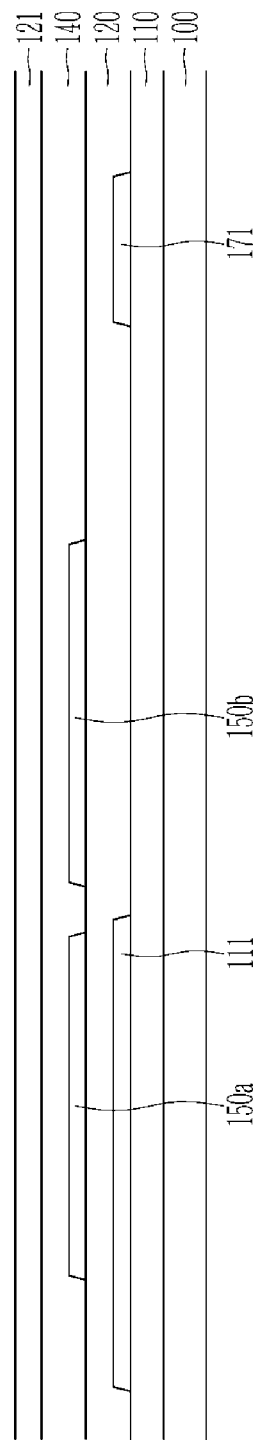

Next, referring to FIG. 23, a gate insulating film 140 and a gate layer 121 are provided or formed on the first semiconductor layer 150a and the second semiconductor layer 150b.

Figure 24:
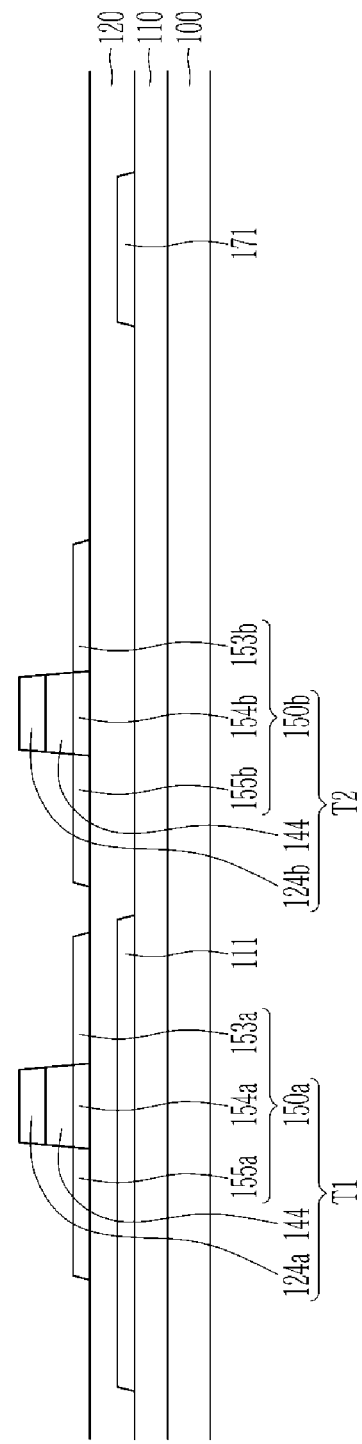

Subsequently, referring to FIG. 24, the gate insulating film 140 and the gate layer 121 are etched to form the first gate electrode 124a, the second gate electrode 124b, and the gate insulating pattern 144. In this process, a third mask may be used. Since the gate insulating film 140 and the gate layer 121 are etched by a same process, the gate insulating pattern 144 may have a same shape as the first gate electrode 124a and the second gate electrode 124b.

Figure 25:
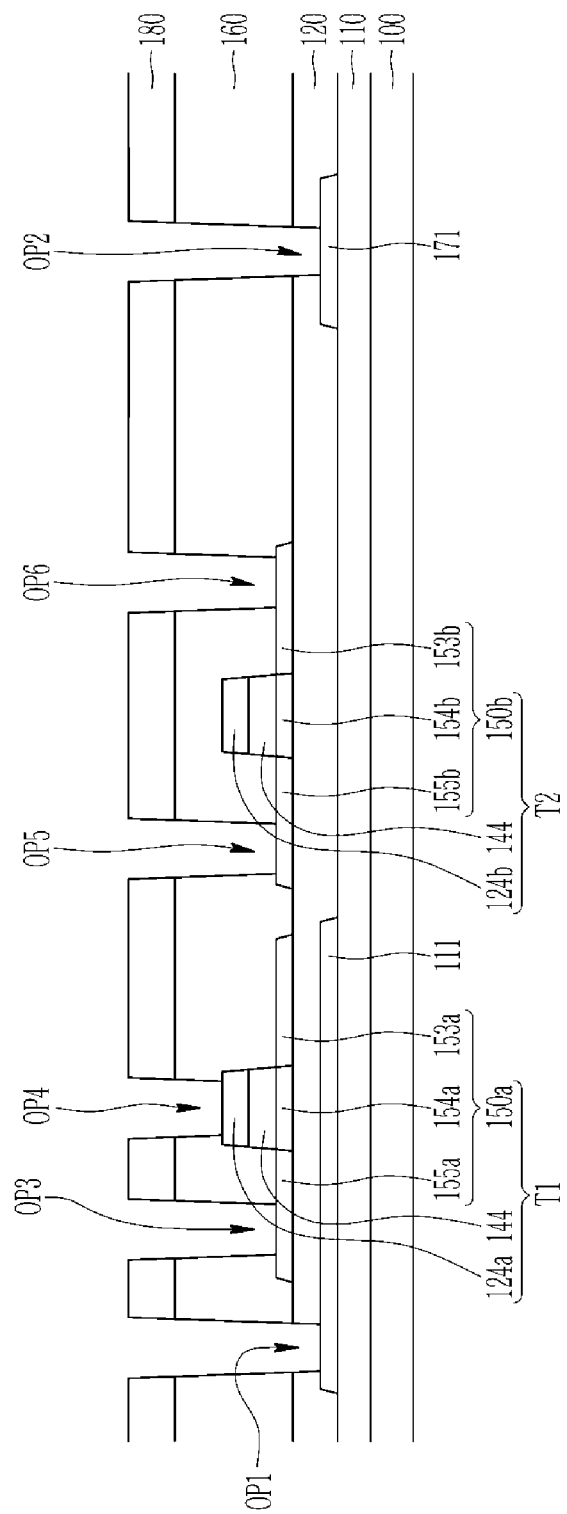

Next, referring to FIG. 25, the intermediate film 160 and the insulating film 180 are provided or formed over the first gate electrode 124a, the second gate electrode 124b, and the gate insulating pattern 144, and the plurality of openings OP1, OP2, OP3, OP4, OP5, and OP6 are formed through the intermediate film 160 and the insulating film 180. A fourth mask may be used in the process of forming the openings. The first opening OP1 may be formed to overlap the light blocking layer 111, and the second opening OP2 may be formed to overlap the data line 171. The third opening OP3 is formed to overlap the drain region 155a of the first semiconductor layer 150a, the fourth opening OP4 is formed to overlap the first gate electrode 124a, the fifth opening OP5 is formed to overlap the drain region 155b of the second semiconductor layer 150b, and the sixth opening OP6 is formed to overlap the source region 153b of the second semiconductor layer 150b.

In such an embodiment, the widths of the third opening OP3, the fifth opening OP5, and the sixth opening OP6 may be in a range of about 7 μm to about 9 μm. In such an embodiment, the areas of the third opening OP3, the fifth opening OP5, and the sixth opening OP6 may be in a range of about 49 μm$^2$ to about 81 μm$^2$. In such an embodiment, the definition of the shapes and widths of the third opening OP3, the fifth opening OP5, and the sixth opening OP6 may be the same as those described above with reference to FIG. 8 to FIG. 13.

Figure 26:
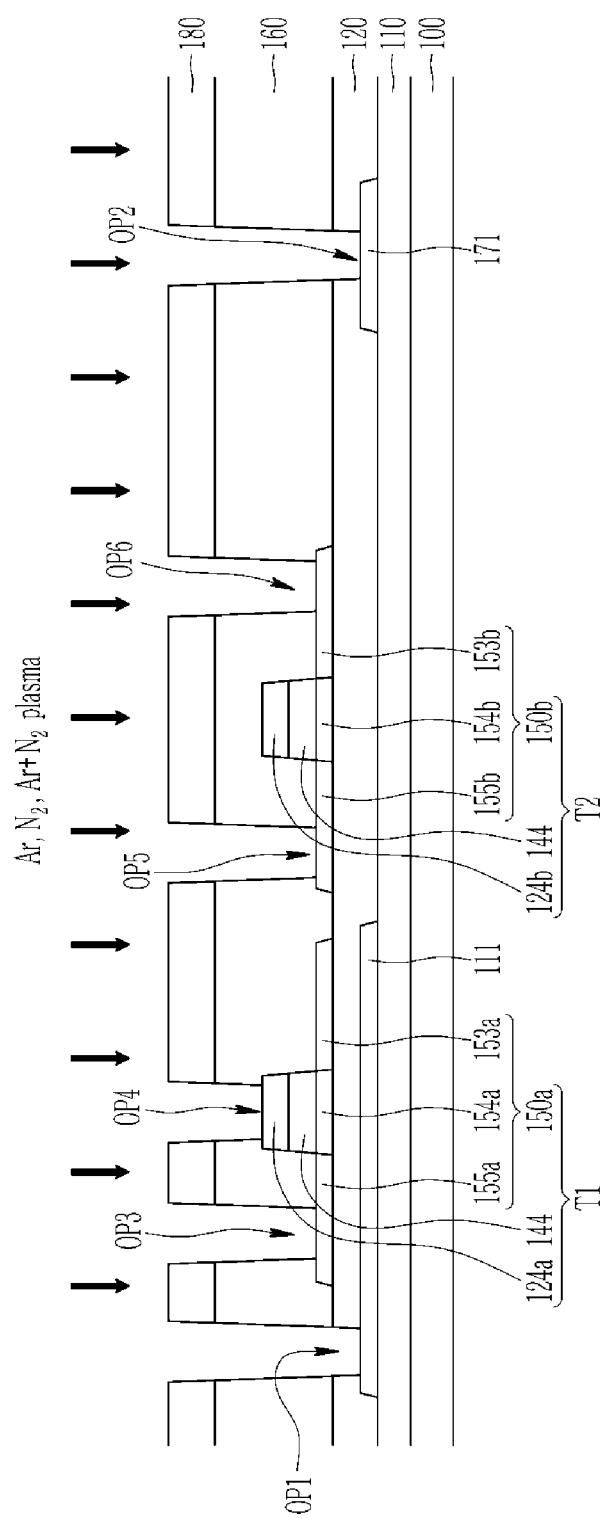

Referring to FIG. 26, plasma treatment is then performed. In an embodiment, the plasma treatment may be performed for 30 seconds to 90 seconds with a power in a range of 1.5 kilowatts (kW) to 2.5 kW. During the plasma treatment process, vacancies are formed inside the semiconductor layers 150a and 150b. This is because inert gas collides with the semiconductor layers 150a and 150b, thereby disturbing the atoms inside the semiconductor layers 150a and 150b, or releasing atoms out.

Figure 27:
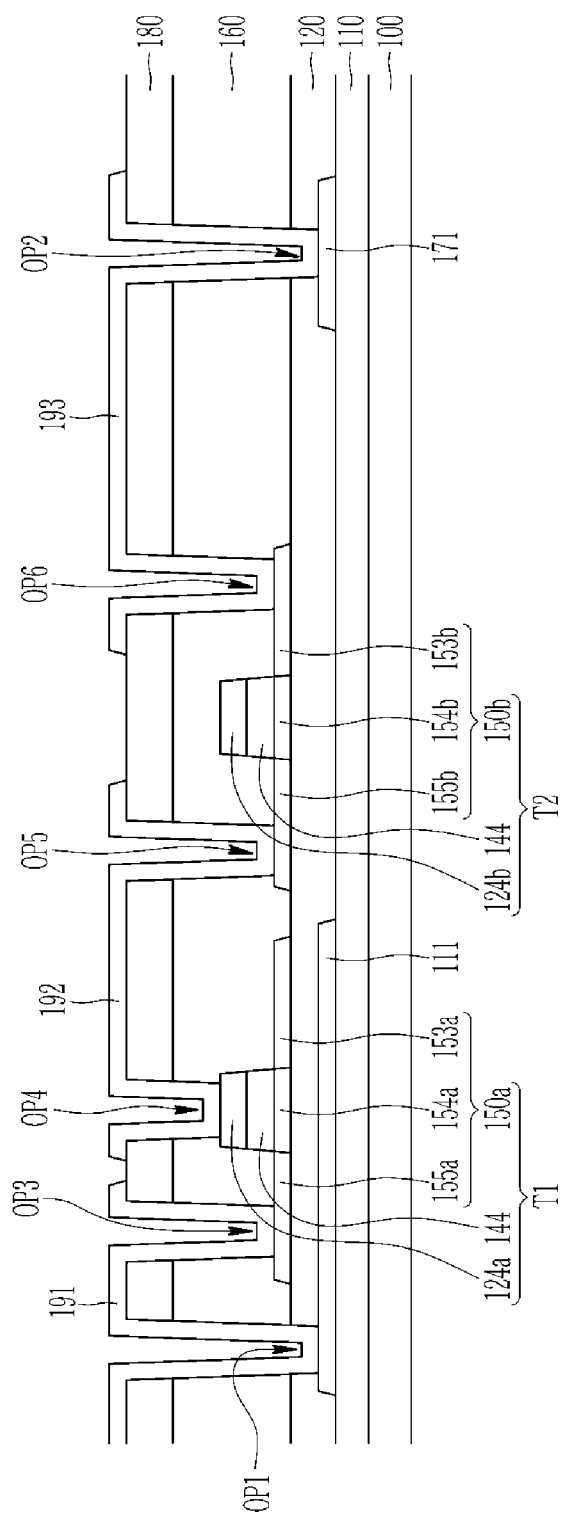

Next, referring to FIG. 27, the first electrode 191, the first connection electrode 192, and the second connection electrode 193 are provided or formed in respective openings OP1, OP2, OP3, OP4, OP5, and OP6, and on the insulating film 180. In this process, a fifth mask may be used.

The first electrode 191 contacts the light blocking layer 111 through the first opening OP1 and the source region 153a of the first semiconductor layer 150a through the third opening OP3. The first connection electrode 192 contacts the first gate electrode 124a of the first semiconductor layer 150a through the fourth opening OP4 and the drain region 155b of the second semiconductor layer 150b through the fifth opening OP5. The second connection electrode 193 contacts the source region 153b of the second semiconductor layer 150b through the sixth opening OP6 and the data line 171 through the second opening OP2.

Figure 28:
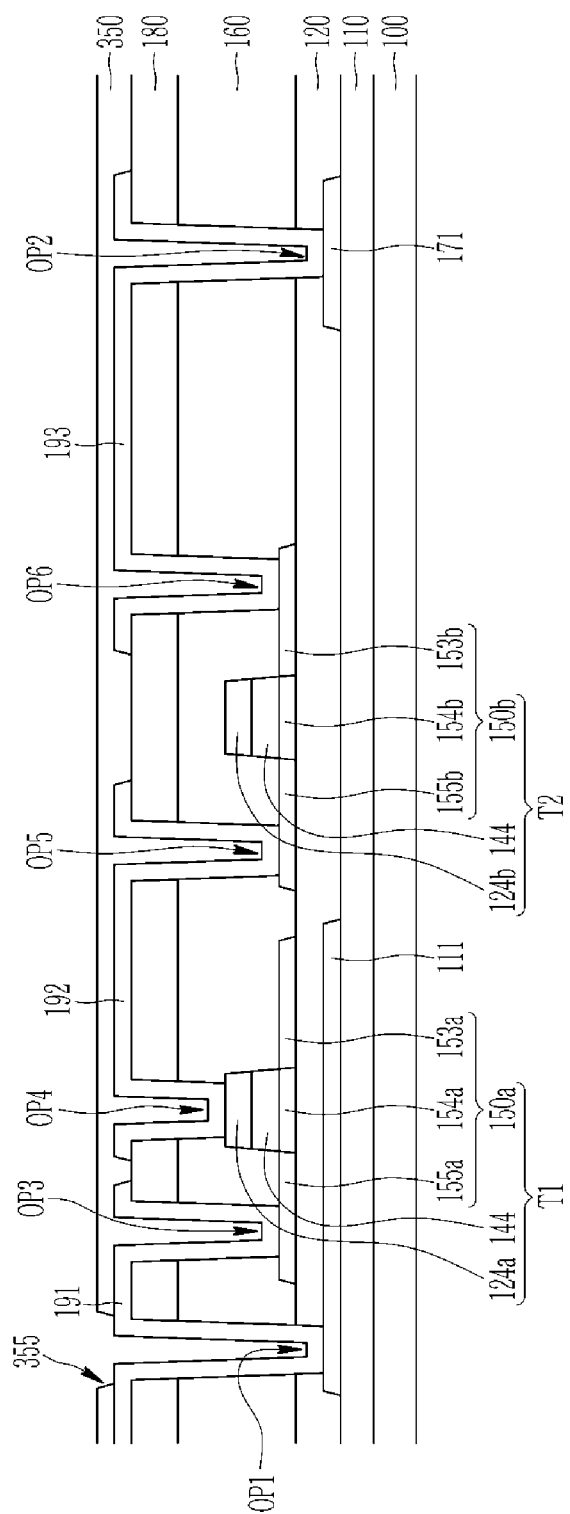

Next, referring to FIG. 28, the partition wall 350 is provided or formed on the first electrode 191, the first connection electrode 192, and the second connection electrode 193. The partition wall 350 includes the opening 355 overlapping the first electrode 191, and a sixth mask may be used in this process.

As described above, according to an embodiment of the manufacturing method of the display device, a source electrode and a drain electrode are not included, and a data voltage is transmitted to each transistor through the first connection electrode 192 and the second connection electrode 193 disposed in a same layer as the first electrode 191. Therefore, in such an embodiment, the number of masks used in the manufacturing process may be reduced, such that the manufacturing process may be simplified by being performed with six masks.

In an embodiment of the display device manufactured as described above, the width of the opening overlapping the semiconductor layers 150a and 150b is in a range of about 7 μm to about 9 μm, or the area thereof is in a range of about 49 μm$^2$ to about 81 μm$^2$. The width or area of the opening may be determined to prevent the semiconductor layer from functioning as a conductor by excess hydrogen contained in SiNx when the display device includes a SiNx film therein for protection of an element. This is because, as described above, the larger the area of the opening, the more the number of vacancies formed by the plasma treatment increases, and the vacancies are combined with hydrogen ions inside the semiconductor layer to remove the hydrogen ions.

As described above, an embodiment of the display device may include a SiNx film adjacent to the semiconductor layer, and may be applied to various structures if the semiconductor layer includes an oxide semiconductor. As described above, since such an embodiment of the display device may be manufactured using six masks, a source electrode is omitted, and the connection electrode disposed in a same layer as the first electrode 191 may be applied to a structure for transmitting a data voltage.

Figure 29:
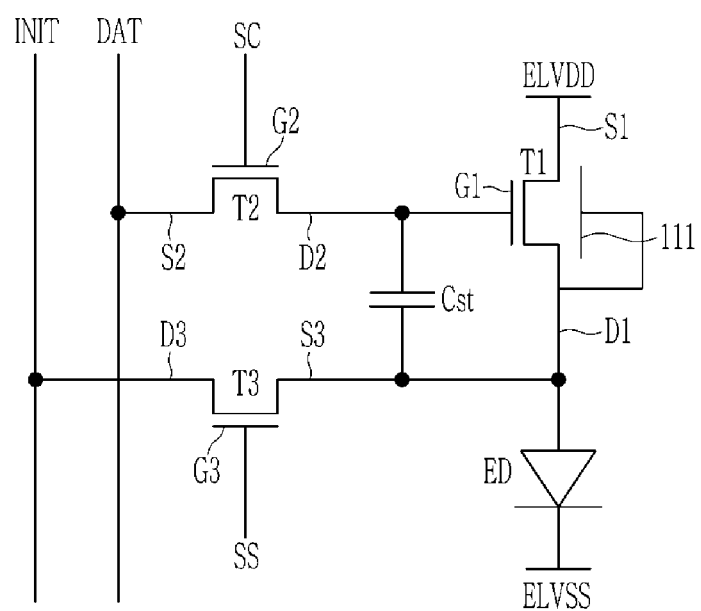
FIG. 29 illustrates a circuit diagram of a pixel according to an embodiment of the invention.

Hereinafter, pixels of an embodiment of the display device will be briefly described. FIG. 29 illustrates a circuit diagram of a pixel according to an embodiment of the invention.

Referring to FIG. 29, an embodiment of the display device includes a plurality of pixels, and each pixel may include a plurality of transistors T1, T2, and T3, a capacitor Cst, and a light emitting diode ED. Hereinafter, for convenience of description, an embodiment in which each pixel includes a single light emitting diode ED as shown in FIG. 29 will be described in detail, but not being limited thereto.

In an embodiment, the plurality of transistors T1, T2, and T3 of a pixel include a first transistor T1, a second transistor T2, and a third transistor T3. A source electrode and a drain electrode, which will be described below, are used to distinguish two electrodes disposed at opposite sides of a channel of each of the transistors T1, T2, and T3, and the source electrode and the drain electrode may be interchanged.

A gate electrode G1 of the first transistor T1 is connected to one end of the capacitor Cst, a source electrode S1 of the first transistor T1 is connected to a driving voltage line for transmitting a driving voltage ELVDD, and a drain electrode D1 of the first transistor T1 is connected to an anode of the light emitting diode ED and the other end of the capacitor Cst. The first transistor T1 may receive a data voltage DAT based on a switching operation of the second transistor T2, and supply a driving current to the light emitting diode ED corresponding to a voltage stored in the capacitor Cst. The drain electrode D1 of the first transistor T1 may be connected to the light blocking layer 111.

A gate electrode G2 of the second transistor T2 is connected to a first scan line that transmits a first scan signal SC, a source electrode S2 of the second transistor T2 is connected to a data line that may transmit the data voltage DAT or a reference voltage, and a drain electrode D2 of the second transistor T2 is connected to one end of the capacitor Cst and the gate electrode G1 of the first transistor T1. The second transistor T2 is turned on in response to the first scan signal SC to transmit the reference voltage or the data voltage DAT to the gate electrode G1 of the first transistor T1 and one end of the capacitor Cst.

A gate electrode G3 of the third transistor T3 is connected to a second scan line for transmitting a second scan signal SS, a source electrode S3 of the third transistor T3 is connected to the other end of the capacitor Cst, the drain electrode D1 of the first transistor T1, and the anode of the light emitting diode ED, and a drain electrode D3 of the third transistor T3 is connected to an initialization voltage line for transmitting an initialization voltage INIT. The third transistor T3 is turned on in response to the second scan signal SS to transmit the initialization voltage INIT to the anode of the light emitting diode ED and the other end of the storage capacitor Cst, thereby initializing the anode voltage of the light emitting diode ED.

One end of the capacitor Cst is connected to the gate electrode G1 of the first transistor T1, and the other end thereof is connected to the source electrode S3 of the third transistor T3 and the anode of the light emitting diode ED. The cathode of the light emitting diode ED is connected to a common voltage line for transmitting a common voltage ELVSS.

The light emitting diode ED may emit light corresponding to a driving current outputted from the first transistor T1.

An embodiment of the display device described above may be applied to a display device having the circuit diagram of FIG. 29. However, this is merely exemplary, and the invention is not limited thereto.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate;
   a first semiconductor layer disposed on the substrate, wherein the first semiconductor layer includes a channel region and a doped region;
   a first gate electrode disposed to overlap the channel region of the first semiconductor layer;
   an intermediate film disposed on the first semiconductor layer and the first gate electrode;
   a first electrode disposed on the intermediate film; and
   an light emitting layer disposed on the first electrode,
   wherein an opening is defined through the intermediate film to overlap the doped region of the first semiconductor layer,
   the doped region of the first semiconductor layer and the first electrode contact each other through the opening of the intermediate film,
   an area of a cross-section of the opening of the intermediate film parallel to the substrate is in a range of about 49 $\mu m^2$ to about 81 $\mu m^2$, and
   the light emitting layer directly contacts the first electrode.

2. The display device of claim 1, wherein
   the first semiconductor layer includes an oxide semiconductor.

3. The display device of claim 1, wherein
   the intermediate film includes a silicon nitride.

4. The display device of claim 1, further comprising:
   an insulating film disposed between the intermediate film and the first electrode,
   wherein an entire region of the intermediate film contacts the insulating film, and
   the insulating film includes an organic material.

5. The display device of claim 1, further comprising:
   a light blocking layer disposed between the substrate and the first semiconductor layer; and
   a buffer layer disposed between the light blocking layer and the first semiconductor layer,
   wherein an opening is defined through the buffer layer to overlap the light blocking layer, and
   the first electrode and the light blocking layer contact each other through the opening of the buffer layer.

6. The display device of claim 5, further comprising:
   a second semiconductor layer disposed in a same layer as the first semiconductor layer, wherein the second semiconductor layer includes a channel region and a doped region; and
   a first connection electrode disposed in a same layer as the first electrode,
   wherein the first connection electrode contacts the first gate electrode and the doped region of the second semiconductor layer, and connects the first gate electrode and the second semiconductor layer to each other.

7. The display device of claim 6, further comprising:
   a data line disposed in a same layer as the light blocking layer; and
   a second connection electrode disposed in a same layer as the first electrode,
   wherein the second connection electrode contacts the data line and the doped region of the second semiconductor layer, and connects the data line and the second semiconductor layer to each other.

8. The display device of claim 1, wherein
   a shape of a cross-section of the opening of the intermediate film parallel to the substrate is one selected from a polygonal shape, a circular shape, an elliptical shape, and a shape including a plurality of sides and curved lines connecting the sides to each other.

9. The display device of claim 1, wherein
   a threshold voltage of the first semiconductor layer is in a range of about −1.0 V to about 1.0 V.

10. A display device comprising:
    a substrate;
    a first semiconductor layer disposed on the substrate, wherein the first semiconductor layer includes a channel region and a doped region;
    a first gate electrode disposed to overlap the channel region of the first semiconductor layer;
    an intermediate film disposed on the first semiconductor layer and the first gate electrode;
    a first electrode disposed on the intermediate film; and an light emitting layer disposed on the first electrode, wherein an opening is defined through the intermediate film to overlap the doped region of the first semiconductor layer, the doped region of the first semiconductor layer and the first electrode contact each other through the opening of the intermediate film, the first semiconductor layer includes an oxide semiconductor, the intermediate film includes a silicon nitride, a width of the opening of the intermediate film is in a range of about 7 μm to about 9 μm, and the light emitting layer directly contacts the first electrode.

11. The display device of claim 10, wherein a shape of a cross-section of the opening of the intermediate film parallel to the substrate is one selected from a polygonal shape, a circular shape, an elliptical shape, and a shape including a plurality of sides and curved lines connecting the sides to each other, the width of the opening is a length of a longest side when the cross-section of the opening is a polygon or the shape including the plurality of sides and the curved lines connecting the sides to each other, the width of the opening is a length of a diameter when the cross-section of the opening is circular, and the width of the opening is a length of a long axis when the cross-section of the opening is elliptical.

12. The display device of claim 10, further comprising:

a second semiconductor layer disposed in a same layer as the first semiconductor layer, wherein the second semiconductor layer includes a channel region and a doped region; and a first connection electrode disposed in a same layer as the first electrode, wherein the first connection electrode contacts the first gate electrode and the doped region of the second semiconductor layer, and connects the first gate electrode and the second semiconductor layer to each other.

13. The display device of claim 12, further comprising:

a data line disposed between the substrate and the second semiconductor layer;

a buffer layer disposed between the data line and the second semiconductor layer; and a second connection electrode disposed in a same layer as the first electrode, wherein the second connection electrode contacts the data line and the doped region of the second semiconductor layer, and connects the data line and the second semiconductor layer to each other.

14. The display device of claim 10, wherein a threshold voltage of the first semiconductor layer is in a range of about −1.0 V to about 1.0 V.

* * * * *